(12) United States Patent
White

(10) Patent No.: US 8,472,904 B2
(45) Date of Patent: Jun. 25, 2013

(54) ANTENNA WITH INTEGRATED TUNING DETECTION ELEMENTS

(75) Inventor: Douglas W. White, Lexington, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 528 days.

(21) Appl. No.: 12/559,687

(22) Filed: Sep. 15, 2009

(65) Prior Publication Data

US 2010/0248649 A1 Sep. 30, 2010

Related U.S. Application Data

(60) Provisional application No. 61/164,658, filed on Mar. 30, 2009.

(51) Int. Cl.
*H04B 1/18* (2006.01)
*H04B 1/06* (2006.01)

(52) U.S. Cl.
USPC .......... 455/193.1; 455/193.2; 455/193.3; 455/272; 455/273; 455/274; 455/120; 455/121; 455/123; 455/125

(58) Field of Classification Search
USPC .......... 455/193.1, 193.2, 193.3, 272, 273, 455/274, 120, 121, 123, 125
See application file for complete search history.

(56) References Cited

U.S. PATENT DOCUMENTS

| | | | |
|---|---|---|---|
| 3,590,385 A | 6/1971 | Sabo et al. | |
| 3,889,268 A | 6/1975 | Peters | |
| 4,521,913 A | 6/1985 | Huber et al. | |
| 4,564,843 A | 1/1986 | Cooper | |
| 4,780,724 A | 10/1988 | Sharma et al. | |
| 5,005,019 A | 4/1991 | Zaghloul et al. | |
| 5,225,847 A | 7/1993 | Roberts et al. | |
| 5,241,321 A | 8/1993 | Tsao | |
| 5,301,358 A | 4/1994 | Gaskill et al. | |
| 5,491,715 A | 2/1996 | Flaxl | |
| 5,856,809 A | 1/1999 | Schoepfer | |
| 5,874,919 A | 2/1999 | Rawnick et al. | |
| 6,072,434 A | 6/2000 | Papatheodorou | |
| 6,075,485 A | 6/2000 | Lilly et al. | |
| 6,081,700 A * | 6/2000 | Salvi et al. | 455/193.3 |
| 6,317,084 B1 | 11/2001 | Chen et al. | |
| 6,501,427 B1 | 12/2002 | Lilly et al. | |
| 6,505,041 B1 * | 1/2003 | Borgstrand | 455/423 |
| 6,650,294 B2 | 11/2003 | Ying et al. | |

(Continued)

OTHER PUBLICATIONS

Arcioni et al. "A novel low reflection-loss MEMS reconfigurable patch antenna," 2007 European Microwave Conference, Oct. 9-12, 2007, pp. 1015-1018.

(Continued)

*Primary Examiner* — Wen Huang
(74) *Attorney, Agent, or Firm* — Goodwin Procter LLP

(57) ABSTRACT

In various embodiments, systems and methods for automatically tuning an antenna to a desired frequency utilize a tuning detection element that sends or receives a signal in accordance with one mode of the antenna and that is separated from the antenna by a gap and outside of a signal path of the antenna. In various system implementations, a processor communicates with the tuning detection element and antenna and monitors the amplitude of a signal transmitted to or from the tuning detection element. A resonant frequency of the antenna may be tuned to the desired frequency by a tuning element.

41 Claims, 8 Drawing Sheets

U.S. PATENT DOCUMENTS

| | | | |
|---|---|---|---|
| 6,657,595 B1* | 12/2003 | Phillips et al. | 343/702 |
| 6,680,703 B1 | 1/2004 | McConnell | |
| 6,717,549 B2 | 4/2004 | Rawnick et al. | |
| 7,180,464 B2* | 2/2007 | Chiang et al. | 343/833 |
| 7,379,714 B2* | 5/2008 | Haque et al. | 455/107 |
| 7,463,870 B2* | 12/2008 | Peusens et al. | 455/130 |
| 7,801,556 B2* | 9/2010 | Tran | 455/552.1 |
| 2003/0214437 A1 | 11/2003 | Rawnick et al. | |
| 2006/0022874 A1 | 2/2006 | Snyder | |
| 2006/0044187 A1 | 3/2006 | Sager et al. | |
| 2006/0252391 A1* | 11/2006 | Poilasne | 455/121 |
| 2007/0091006 A1* | 4/2007 | Thober et al. | 343/745 |

OTHER PUBLICATIONS

Bhartia et al. "A frequency agile microstrip antenna," 1982 Antennas and Propagation Society International Symposium, vol. 20, May 1982, pp. 304-307.

Blondy et al. "A Wide Tuning Range MEMS Switched Patch Antenna," 2006 IEEE MTT-S International Microwave Symposium Digest, Jun. 2006, pp. 152-154.

de Mingo et al. "An RF electronically controlled impedance tuning network design and its application to an antenna input impedance automatic matching system," IEEE Transactions on Microwave Theory and Techniques, vol. 52, Issue 2, Feb. 2004, pp. 489-497.

du Plessis et al. "Tuning stubs for microstrip-patch antennas," IEEE Antennas and Propagation Magazine, vol. 36, Issue 6, Dec. 1994, pp. 52-56.

Hall et al. "Adaptive tuning of microstrip antennas," IEE Colloquium on Design of Mobile Handset Antennas for Optimal Performance in the Presence of Biological Tissue, Digest No. 1997/022, Jan. 20, 1997, pp. 3/1-3/3.

Hall et al. "Microstrip patch antenna with integrated adaptive tuning," Tenth International Conference on Antennas and Propagation, Conf. Publ. No. 436, vol. 1, Apr. 14-17, 1997, pp. 506-509.

Haskins et al. "Independent Control of Resonant Frequency and Input Impedance of a Microstrip Patch by Individually Biased Varactor Diodes," Electronics Letters, vol. 32, No. 4, Feb. 15, 1996, pp. 284-286.

Haskins et al. "Polarization, phase and frequency agility in varactor diode loaded patches," 2000 Asia-Pacific Microwave Conference, Dec. 3-6, 2000, pp. 747-750.

Haskins et al. "Varactor-diode loaded passive polarisation-agile patch antenna," Electronics Letters, vol. 30, Issue 13, Jun. 23, 1994, pp. 1074-1075.

Holland et al. "Tunable coplanar patch antenna using varactor," Electronics Letters, vol. 42, Issue 6, Mar. 16, 2006, pp. 319-321.

Jin et al. "An L-band tunable microstrip antenna using multiple varactors," 2003 IEEE Antennas and Propagation Society International Symposium, vol. 4, Jun. 22-27, 2003, pp. 524-527.

Jose et al. "Low voltage tunable capacitors for RF MEM filters and antenna applications," 2001 IEEE Antennas and Propagation Society International Symposium, vol. 3, Jul. 8-13, 2001, pp. 670-673.

Kaya et al. "Design of a new impedance tuning network by using RC mutator," Microwave and Optical Technology Letters, vol. 49, No. 2, Feb. 2007, pp. 298-302.

Korosec et al. "Varactor-tuned microstrip-patch antenna with frequency and polarisation agility," Electronics Letters, vol. 42, Issue 18, Aug. 31, 2006, pp. 1015-1016.

Lewis et al. "Quiet tuning and matching of antennas for radio-silence operation," IEE Proceedings F Communications, Radar and Signal Processing, vol. 127, No. 5, Oct. 1980, pp. 361-367.

Moritz et al. "Frequency agile antenna tuning and matching," Eighth International Conference on HF Radio Systems and Techniques, 2000, IEE Conf. Publ. No. 474, Jul. 10-13, 2000, pp. 169-174.

Noren "Thin Film Barium Strontium Titanate (BST) for a New Class of Tunable RF Components," Microwave Journal, Wed. May 19, 2004, 9 pages.

Oh et al. "Automatic antenna-tuning unit for software-defined and cognitive radio," Wireless Communications and Mobile Computing, vol. 7, No. 9, Nov. 2007, pp. 1103-1115.

Pozar "Trimming stubs for microstrip feed networks and patch antennas," ed. Hal Schrank, IEEE Antennas and Propagation Society Newsletter, Dec. 1987, pp. 26-28.

Rostbakken et al. "Adaptive feedback frequency tuning for microstrip patch antennas," Ninth International Conference on Antennas and Propagation, vol. 1, Apr. 4-7, 1995, pp. 166-170.

Sjöblom et al. "Characterization of a CMOS impedance tuning unit for DVB-H," Analog Integrated Circuits and Signal Processing, vol. 52, No. 3, Sep. 2007, pp. 79-87.

Sjöblom et al. "CMOS antenna tuning unit for 2.4 GHz ISM band," 2005 IEEE MTT-S International Microwave Symposium Digest, Jun. 12-17, 2005, pp. 279-282.

Sun et al. "Component value ranges of tunable impedance matching networks in RF communications systems," 7th International Conference on High Frequency Radio Systems and Techniques (CP441), Nottingham, UK, Jul. 7-10, 1997, pp. 185-189.

Sun et al. "High-speed automatic antenna tuning units," Ninth International Conference on Antennas and Propagation (ICAP) (CP407), Eindhoven, Netherlands, Apr. 4-7, 1995, pp. v1-218.

Tombak et al. "Tunable barium strontium titanate thin film capacitors for RF and microwave applications," IEEE Microwave and Wireless Components Letters, vol. 12, Issue 1, Jan. 2002, pp. 3-5.

Tsang et al. "Wide Tuning Range RF-MEMS Varactors Fabricated Using the PolyMUMPs Foundry," Microwave Journal, Aug. 1, 2003, pp. 22.

Underhill "Simple quiet tuning and matching of antennas," Radio Communication, vol. 57, No. 5, May 1981, pp. 420-422.

Underhill et al. "Quiet tuning of antennas," Electronics Letters 15, 1979, pp. 37-38.

Zólomy et al. "Automatic antenna tuning for RF transmitter IC applying high Q antenna," 2004 IEEE Radio Frequency Integrated Circuits (RFIC) Symposium, Digest of Papers, Jun. 6-8, 2004, pp. 501-504.

* cited by examiner

ANTENNA WITH INTEGRATED TUNING DETECTION ELEMENTS

CROSS-REFERENCE TO RELATED APPLICATIONS

This application claims priority to and the benefit of U.S. Provisional Patent Application Ser. No. 61/164,658, filed on Mar. 30, 2009, which is hereby incorporated herein by reference in its entirety.

STATEMENT REGARDING FEDERALLY SPONSORED RESEARCH OR DEVELOPMENT

The U.S. Government has a paid-up license in this invention and the right in limited circumstances to require the patent owner to license others on reasonable terms.

TECHNICAL FIELD

The present invention relates, in various embodiments, to antenna tuning circuits, and in particular to low-loss, low-power automatic antenna tuning circuits.

BACKGROUND

Many modern electronic devices, especially low-power portable devices, demand small antennas to transmit and receive wireless signals. As antennas decrease in size, however, their bandwidth narrows, and it becomes increasingly important to ensure that they are properly tuned to a desired frequency (i.e., the antenna's resonant frequency is adjusted to match the frequency of an incoming signal). But, even an antenna that is perfectly tuned initially is subject to environmental factors that may adversely affect its frequency and/or impedance, and, furthermore, an application may require an antenna to transmit and receive signals over multiple frequencies. Therefore, an automatic tuning system may be necessary to dynamically tune the antenna to a desired frequency and/or adjust the impedance of the antenna. One element typically present in an automatic tuning system is a means for determining the resonant frequency and impedance match of the antenna, preferably without introducing appreciable loss into the system.

One approach for automatic tuning is to inject a signal into an antenna input connection and observe the reflected signal. This approach generally requires introducing a network and/or a circuit element (e.g., a coupler or a switch) between the antenna and the system using the antenna (e.g., a radio). Any approach, however, that introduces circuitry between the antenna and the system that uses the antenna will generally introduce loss into the system, which degrades the system noise figure and dissipates transmit power. The loss in transmit power may be compensated for, but, for systems where power is a limited resource, such as battery-operated systems, the penalty may be a significant increase in battery size or a large drop in battery life. Unlike the loss in transmit power, the impact on the system noise figure when a signal is received at the antenna is typically irreversible, and cannot be compensated for.

Other automatic tuning techniques involve monitoring the phase difference between the current and voltage at the antenna, which will approach zero when the antenna is at resonance, or using a separate, inductively coupled loop to sense the tuning of a loop antenna. Observing just the signals at the input of an antenna, however, whether through the current/voltage phase relationship or through the forward and reflected signals, does not allow determination of the quality of circular polarization. Many circularly polarized antennas have two modes in quadrature, and the amplitude and phase relationship cannot be easily determined from impedance measurements at the antenna input(s) alone.

A need therefore exists for a low-power, low-loss antenna tuning detection system that is capable of determining the tuning state of modern antennas, including ones with multiple modes.

SUMMARY

Embodiments of the present invention include systems and methods for determining the tuning of an antenna without adding circuitry between the antenna and the system that uses the antenna (e.g., a radio), thereby eliminating any loss in power or signal quality incurred by the presence of such circuitry. In one embodiment, small tuning detection elements are electromagnetically or electrostatically coupled to the antenna, and the antenna's resonant frequency may be determined by observing the signals received by or transmitted from the tuning detection elements. Tuning elements may be connected directly to the antenna element(s) and be used to adjust the resonant frequency in accordance with the amplitude of a received signal. Thus, the tuning detection elements (and, in some embodiments, also the tuning elements) are removed from the signal path of the antenna and do not interfere with the antenna's signal quality. In one embodiment, the receive noise figure and transmit power are not degraded, thereby saving on battery size and weight and improving the overall system performance as compared to conventional tuning detection approaches. Further embodiments are also capable of independently determining the tuning of orthogonal modes in a multi-mode or circularly polarized antenna.

In general, in one aspect, a system for automatically tuning an antenna to a desired frequency includes a signal path for receiving a signal from, or transmitting a signal to, an antenna. The system further includes a tuning detection element that operates in accordance with one mode of the antenna and that is separated from the antenna by a gap and located outside of the signal path, and a tuning element that tunes a resonant frequency of the antenna to the desired frequency in response to a signal received from a processor.

In one embodiment, the tuning element is also located outside of the signal path. The instruction from the processor may maximize the received signal. The system may further include a low-noise amplifier in the signal path, and/or a feedback path for transmitting a portion of an output of the signal path to the processor. The processor may include, for example, a driver circuit for driving the tuning detection element with a tuning signal and/or a receiver circuit for receiving a tuning signal from the tuning detection element. In one embodiment, the system further includes at least one additional tuning detection element that operates in accordance with at least one additional mode of the antenna.

The signal path may communicate a circularly polarized signal. For its part, the antenna may be a patch antenna, a planar inverted-F antenna, a monopole antenna, and/or a dipole antenna. The tuning element may be a variable capacitance and/or inductance device, a varactor diode, a switched metal element, a switched capacitor, and/or any similar device that provides a variable reactance.

In general, in another aspect, a method for automatically tuning an antenna to a desired frequency includes driving a tuning detection element outside of a signal path in accordance with one mode of the antenna. The tuning detection element may be separated from the antenna by a gap. The method further includes receiving a signal from the tuning detection element, through the antenna, and monitoring an amplitude of the received signal with a processor. A resonant frequency of the antenna may be tuned to the desired frequency with a tuning element located outside of the signal path, in response to a signal received from the processor.

The method may further include driving at least one additional tuning detection element in accordance with at least one additional mode of the antenna. Tuning the antenna may include either maximizing or minimizing the amplitude of the received signal. At least one additional signal may be received from the additional tuning detection element(s), through the antenna, on the signal path.

The antenna may be tuned to receive a circularly polarized signal and/or to adjust the amplitude of the signal received, through the antenna, on the signal path. Again, the tuning element may be located outside of the signal path. The antenna may be a patch antenna, a planar inverted-F antenna, a monopole antenna, and/or a dipole antenna. The tuning element may be a variable capacitance and/or inductance device, a varactor diode, a switched metal element, a switched capacitor, and/or any similar device that provides a variable reactance.

In general, in yet another aspect, a method for automatically tuning an antenna to a desired frequency includes transmitting a signal to the antenna over a signal path and receiving one mode of the signal at a tuning detection element located outside of the signal path and separated from the antenna by a gap. A processor monitors an amplitude of the received signal, and a resonant frequency of the antenna is tuned to the desired frequency with a tuning element, in response to a signal received from the processor.

In various embodiments, at least one additional mode of the signal is received at least one additional tuning detection element. An amplitude of each additional mode may be monitored with a processor, and tuning the antenna may include increasing or decreasing the amplitude. The antenna may be tuned to transmit a circularly polarized signal. Again, the tuning element(s) may be located outside of the signal path.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Described herein are various embodiments of methods and systems for tuning an antenna by tuning detection elements electromagnetically or electrostatically thereto and changing the reactance of the antenna to adjust the amplitude of a signal detected by the antenna and/or the coupled tuning detection elements. Adjusting the amplitude of the signal may mean increasing or decreasing the amplitude; in one embodiment, the amplitude is increased to a maximum or decreased to a minimum. The tuning systems described herein may be used for many different kinds of antennas, including, but not limited to, patch antennas, planar inverted-F antennas ("PIFAs"), monopole antennas, and dipole antennas.

Figure 1:
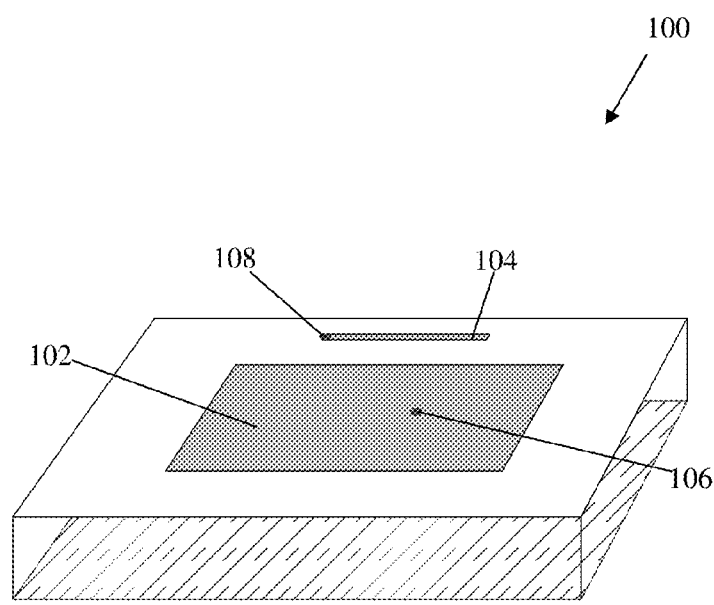
FIG. 1 shows an antenna with one tuning detection element in accordance with one embodiment of the invention.

FIG. 1 shows a structure 100 that includes an antenna 102 and a tuning detection element 104. The antenna 102 is depicted as a patch antenna, but this is not intended to be limiting, and the systems and methods described herein may operate on many different kinds of antennas, as described above. Likewise, the tuning detection element 104 is depicted here as a rectangle, but may take on any appropriate shape or structure, such as a circle, oval, square, or other polygonal shape. The antenna 102 may be fed at a feed point 106, as shown, or may be fed radiatively by a nearby element, or by a direct connection at one edge. In one embodiment, the tuning detection element 104 is fed at a point 108 located near one of its ends.

In one embodiment, the tuning detection element 104 receives a portion of a signal transmitted by the antenna 102. In another embodiment, the tuning detection element 104 may transmit a test signal that is received by the antenna 102. As will be described below, the signal received by either the tuning detection element 104 or the antenna 102 may be monitored and used to tune the antenna 102.

The tuning detection element 104 may be configured such that its resonant frequency is well outside the frequency band of the antenna 102 by, for example, keeping its overall size small relative to the antenna 102. Doing so causes the coupled frequency response to be dominated by the antenna 102 instead of the tuning detection element 104. The tuning detection element 104 may also be placed at a distance from the antenna 102 sufficient to avoid excessive loading and distortion to the antenna's radiation pattern.

Figure 2:
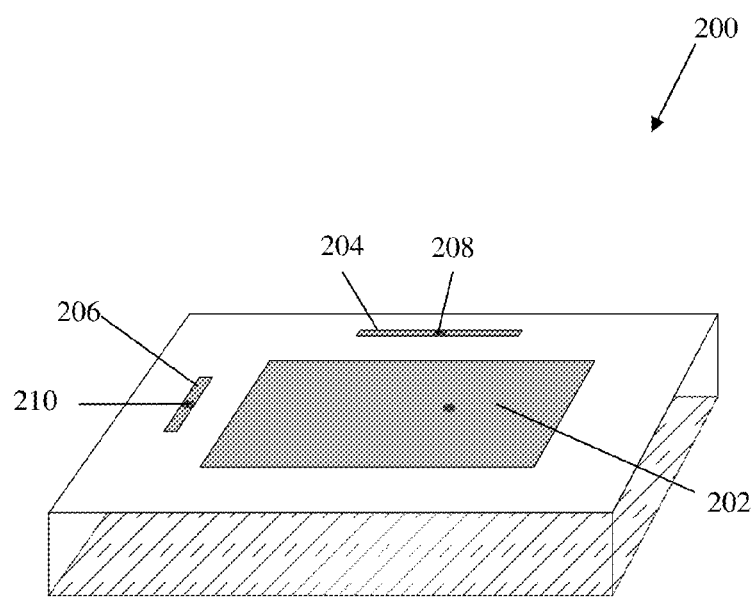
FIG. 2 shows an antenna with two tuning detection elements in accordance with one embodiment of the invention.

FIG. 2 shows a structure 200 that includes an antenna 202 and two tuning detection elements 204, 206. Each tuning detection element 204, 206 may be configured to transmit and receive signals belonging to a single mode of the antenna 202 by changing, for example, its size, shape, orientation, placement, or proximity to the antenna 202. In other embodiments, additional tuning detection elements are used to transmit and receive additional signals corresponding to additional modes of the antenna 202. In some embodiments, a single tuning detection element is used to transmit and receive signals corresponding to more than one mode.

The two tuning detection elements 204, 206 may be configured such that the modes corresponding to each tuning detection element 204, 206 do not interfere with each other, i.e., feature good cross-mode isolation. This feature may be desirable for certain types of applications that use two or more orthogonal modes of operation, and require that each orthogonal mode be isolated from the rest, such as the circularly polarized signals used in some global-positioning system ("GPS") receivers. In one embodiment, the modes of the tuning detection elements 204, 206 are isolated from each other by placing the feed points 208, 210 at the center of the tuning detection elements 204, 206. The tuning detection elements 204, 206 may thus couple electrostatically to the radiating edges of the antenna 202, but the currents induced from an orthogonal mode cancel, thereby providing good cross-mode isolation.

Figure 3:
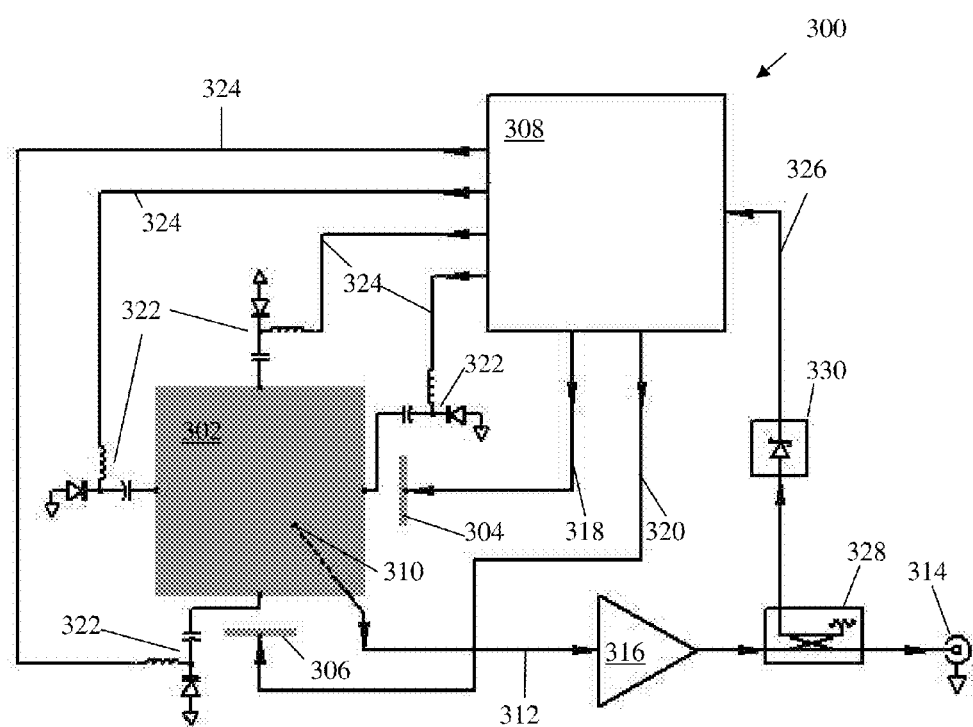
FIG. 3 shows an automatic tuning circuit in accordance with one embodiment of the invention.

FIG. 3 shows an exemplary tuning system using tuning detection elements similar to those described above. The circuit 300 includes an antenna 302, vertical and horizontal tuning detection elements 304, 306, and a processor 308. The antenna 302 may send and receive a signal at a feed point 310 and also communicate received signals over a signal path 312. The received signal is routed to a transceiver circuit (not shown), such as, for example, a radio, a cellular phone, or a GPS receiver, via a connector 314. The transceiver circuit may make use of a signal received by the antenna 302 and/or may transmit a signal to the antenna 302. The strength of the signal may be boosted along the signal path 312 before it reaches the connector 314 and the transceiver circuit connected thereto by an amplifier 316, such as a low-noise amplifier ("LNA").

The elements of the automatic tuning system will now be described in detail. In one embodiment, each of the tuning detection elements 304, 306 is connected to the processor 308 by a tuning path 318, 320. As described above, however, the circuit 300 may contain any number of tuning detection elements, depending on the type of antenna and application used, and each tuning path 318, 320 may control one or more tuning detection elements. In one embodiment, the tuning detection elements 304, 306 are predominantly capacitive. Resonating out the capacitance of the tuning detection elements 304, 306 with, for example, a series inductor, may produce a very low source impedance. Additionally, adding a series resistor of, for example, 50 ohms may allow a clean interface to other radio frequency components, and may provide additional isolation between the tuning detection elements 304, 306 and the rest of the system. This approach additionally has an advantage in that the parasitic inductance of the interconnects and resistor may be absorbed into the matching inductance.

In one embodiment, the automatic tuning system includes four variable tuning elements 322, one on each side of the antenna 302, controlled by the processor 308 through tuning paths 324. The variable tuning elements 322 provide a controllable method to change the reactance (i.e., capacitance and/or inductance)—and therefore the resonant frequency—of the antenna 302. Controllable variable capacitance devices may be employed, including varactor diodes, switched metal elements, or switched capacitors, as suitable for the particular kind of antenna 302 to be tuned. In other embodiments, the inductance or reactance of the antenna 302 may be similarly changed. The variable tuning elements 322 may be placed on each side of the antenna 302, as shown in the circuit 300, on opposing sides, or multiple elements 322 may be placed on a single side.

Finally, the processor 308 receives a feedback signal 326 from the signal path 312. The feedback signal 326 may be tapped off from the signal path 312 by a coupler 328, such as a 10 dB coupler. Because the coupler 328 is inserted after the low-noise amplifier, it does not significantly affect the system noise figure, which is set by the low-noise amplifier and anything that precedes it. The power level of the output of the coupler 328 may be detected by an RF power detector 330, whose output is input to the processor 308. In one embodiment, the power detector 330 is a logarithmic power detector. The power detector 300 may be, however, any sensitive RF power detector. In one embodiment, the transceiver circuit includes an RF signal level detector that may be used in place of a separate power detector 330.

Figure 4A:
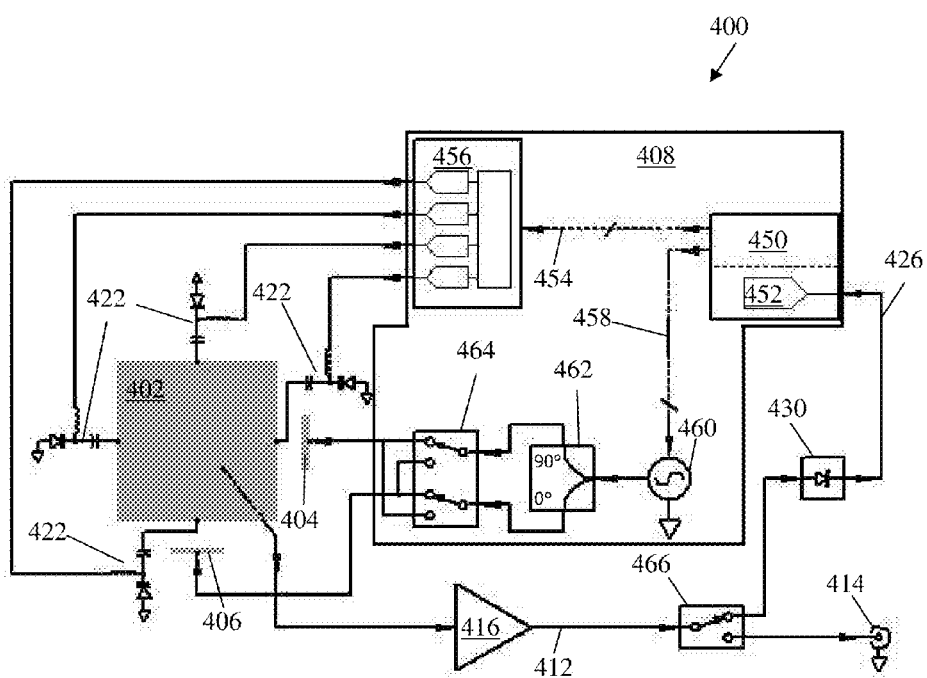
FIG. 4A shows another version of an automatic tuning circuit in accordance with another embodiment of the invention.

FIG. 4A shows an alternative implementation of a tuning circuit 400. The circuit 400 includes an antenna 402, tuning detection elements 404, 406, and a processor 408. The processor 408 has been expanded to show one possible implementation, including a microcontroller 450 with an analog-to-digital converter ("ADC") 452 for receiving an analog feedback signal 426 and converting it to digital form. The microcontroller 450 outputs a set of signals 454 for controlling the variable tuning elements 422 to a quad digital-to-analog converter ("DAC") 456. The DAC 456 converts the digital signals back to analog form and outputs them to the variable tuning elements 422.

In one embodiment, the microcontroller 450 outputs a second set of signals 458 for controlling the tuning detection elements 404, 406. In this example, the antenna 402 uses a circularly polarized signal and, thus, the signals driving the tuning detection elements 404, 406 are designed to be 90 degrees out-of-phase with each other. The second set of signals 458 controls a frequency synthesizer 460. The synthesizer 460 generates a signal and outputs it to a quadrature-hybrid phase shifter 462 that reproduces the signal (i.e., shifted 0 degrees) and also produces a 90-degree phase-shifted version of the signal. In one embodiment, the synthesizer 460 generates two signals at slightly different frequencies corresponding to the two modes used in, for example, single-feed circularly polarized antennas.

The two versions of the generated signal are then sent to a double-pole-double-throw polarization switch 464, which may send the 90-degree phase-shifted signal to either the first tuning detection element 404 or the second tuning detection element 406, depending on whether the application calls for right- or left-handed circular polarization. In an alternative embodiment, the switch 464 is reversed from its depicted position to tune for circular polarization. In this embodiment, the optimum tuning occurs when the signal from the detector 430 is at a minimum or null. This configuration may provide a higher tuning sensitivity and accuracy for certain systems, such as circularly polarized systems, than does tuning for the maximum signal.

Finally, the signal path 412 (including, in one embodiment, an amplifier 416 to set the system noise figure) may be tapped off with a switch 466 instead of the coupler 328, as shown previously in FIG. 3. The switch 466 may be positioned in either a "tune" position, in which case the signal path 412 is routed to the power detector 430, or an "operate" position, in which case the signal path 412 is routed to the transceiver (not shown) via a connector 414. In an alternative embodiment, the transceiver includes a signal level detector that may be used for tuning instead of the detector 430.

Figure 4B:
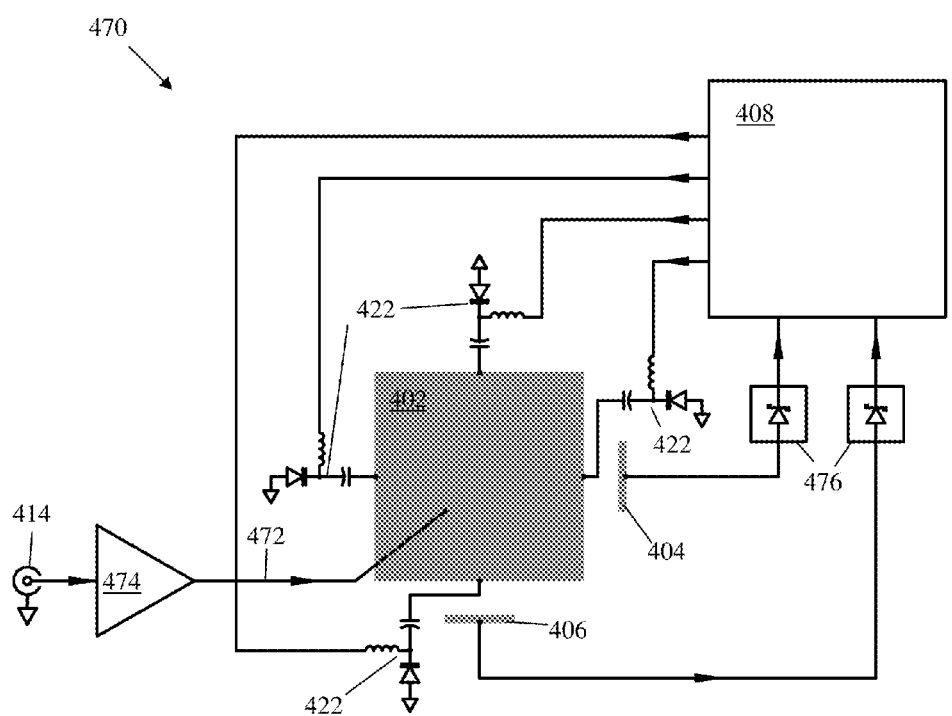
FIG. 4B shows another version of an automatic tuning circuit suitable for transmit applications in accordance with another embodiment of the invention.

FIG. 4B shows, in one embodiment, a tuning circuit 470 for tuning a signal transmitted by the antenna 402 (in contrast to the tuning circuits 300, 400 of FIGS. 3 and 4A, which are configured to tune a signal received by the antenna 402). In FIG. 4B, a signal 472 is fed to the antenna 402 by the transceiver via a transmit power amplifier 474. The antenna 402 transmits portions of the signal 472 to the tuning detection elements 404, 406. Power detectors 476 measure a power level of the signals received by the tuning detection elements 404, 406 and send the detected power levels to the processor 408 for analysis, as described in more detail below.

Figure 5:
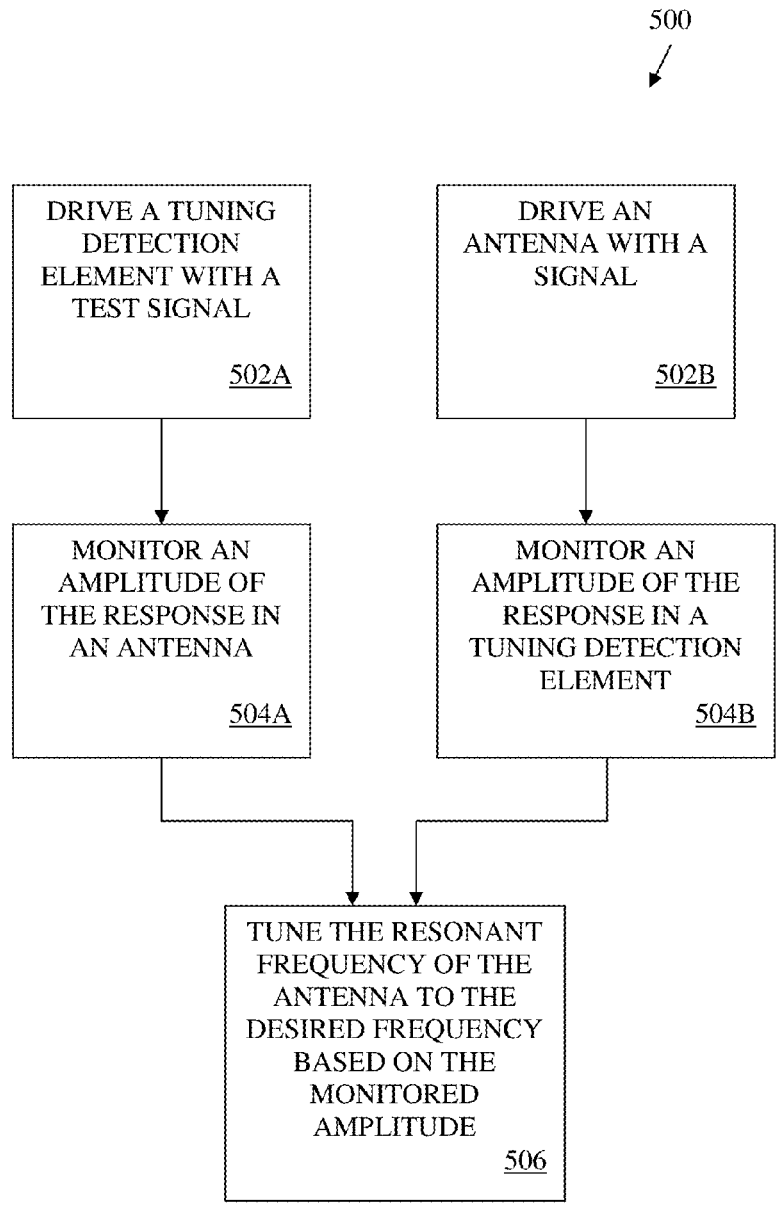
FIG. 5 is a flowchart of methods for automatically tuning an antenna in accordance with embodiments of the invention.

Referring to FIG. 5, two versions of a method 500 for automatically tuning an antenna using the circuits 300, 400 described above will now be described. In summary, in one embodiment, to automatically tune the receive mode of an antenna, energy is radiated proximate an antenna by, e.g., a tuning detection element driven with a test signal (step 502A), and the amplitude of a corresponding signal transmitted to the antenna is monitored (step 504A). In an alternative embodiment, to automatically tune the transmit mode of the antenna, the antenna is first driven with a signal (step 502B) and the amplitude of a corresponding signal transmitted to the tuning detection element is monitored (step 504B). In both embodiments, the antenna is tuned with a tuning element to adjust the amplitude of the monitored signal (step 506).

In greater detail, referring to step 502A and FIG. 3, the receive mode of the antenna 302 may be tuned by radiating energy proximate the antenna by, e.g., driving the tuning detection elements 304, 306 with test signals produced by a processor 308. A portion of the radiated energy may be received by the antenna 302. Each test signal may have a frequency that corresponds to the frequency to be received by the antenna 302. As described above, the processor 308 may control one, two, or more tuning detection elements, depending on the type of antenna 302 to be tuned and the application the antenna 302 is to be used in, and each tuning detection element may correspond to a different mode of the antenna 302. The test signals may be applied to all or some of the tuning detection elements simultaneously or to one of them at a time.

Referring now to step 504A, the test signals are received by the antenna 302 and fed to the signal path 312 via the feed point 310. The amplifier 316 increases the power of the received signals, which are routed back to the processor 308 via the feedback path 326. In one embodiment, the processor 308 monitors the amplitude of the received signals. The processor 308 may maintain a history of incoming signal amplitudes and compare the current signals to a signal level or levels from the past, and determine if an adjustment in the tuning of the antenna 308 is required to be made, as explained below with reference to step 506. In one embodiment, as shown in FIG. 4A, the processor 408 converts the signal to the digital domain for analysis, but embodiments of the processor may include any appropriate circuit for analyzing a signal level, including analog or mixed-signal circuits.

Referring now to step 506 and FIG. 3, if the processor 308 identifies a difference between the current and past signal levels that is greater than a certain threshold, the processor 308 may adjust the signal 324 sent to the variable tuning elements 322. The signal 324 causes the variable tuning elements 322 to change their reactance, thereby changing the tuning (i.e., the resonant frequency) of the antenna 302. As a result, the amplitude of the signals received by the antenna 302 may change, and these changed signals are fed back to the processor 308 for further evaluation in the next monitoring cycle. The processor 308 will continue to change the reactance of the elements 322 and monitor the outcome until the amplitude of the signals received by the antenna 302 is either minimized or maximized, in accordance with the state of the switch 464. In one embodiment, the amplitude of the received signal is maximized when the antenna 302 is receiving a circularly polarized signal. In another embodiment, the amplitude of the received signal is maximized in a coarse tuning mode and minimized in a fine tuning mode, wherein the coarse and fine tuning modes are defined by first and second positions of the switch 464.

Referring to FIG. 5 and also to FIG. 4B, the transmit mode of the antenna 402 may be tuned by driving the antenna 402 with either a test signal 472 or a signal used in the normal operational mode of the antenna (step 502B). The tuning detection elements 404, 406 may receive a portion of the transmitted signal 472, which may be detected by power detectors 476. The processor 408 monitors the amplitude of the signals received at the tuning detection elements 404, 406 (step 504B), as described above with reference to the signal received at the antenna 302 for the tuning of the receive mode. In one embodiment, both the receive mode and the transmit mode of the antenna 402 are tuned in accordance with Steps 502A, 504A, 502B, and 504B; in another embodiment, only one of the transmit mode and the receive mode is tuned.

FIG. 5 depicts exemplary tuning loops for embodiments of the automatic tuning circuits 300, 400, 470 described herein. These processes may also be used, for example, to monitor the status of an already-tuned antenna, thereby protecting against deleterious environmental effects. For example, an environmental effect may cause the tuning of the antenna 302 to shift away from its optimal position. The processor 308 may then detect that the current signal level observed at the antenna 302 or at a tuning detection element 304, 306 has fallen below a predetermined threshold in reference to the prior, optimal signal level, and initiate a change in the variable tuning elements 322. The time taken to re-tune the antenna 308 will depend on how far the tuning of the antenna 302 has fallen away from optimal and on the responsiveness of the variable tuning elements 322 and the processor 308. The antenna 302 may be tuned dynamically to account for conditions that change during normal operation. For example, in transmit mode, the automatic tuning circuits 300, 400 may monitor the status of the antenna 302 in the background as it transmits a data signal, and adjust its tuning accordingly. In receive mode, the automatic tuning circuits 300, 400 may periodically pause receipt of a signal at the antenna 302 to briefly run a tuning update.

In addition, when the system is first started, the processor 308 may not know what the optimal tuning of the antenna 302 is. Therefore, in one embodiment, the processor 308 initiates a "sweep" of the variable tuning elements 322 starting from, for example, their lowest possible capacitive and/or inductive value and increasing to their greatest value. As the tuning of the antenna 302 varies in response, the processor 308 may track the signal received by the antenna 302 or a tuning detection element 304, 306 and note the value where the maximum (or minimum, depending on the tuning mode) received signal occurs. Once the sweep is complete, the processor 308 may assign this value to the variable tuning elements 322, thereby ensuring that the antenna 302 is tuned to the correct frequency.

In other embodiments (e.g., in cases in which the antenna functions over multiple bands), the processor 308 may employ memory storing the values of optimal tuning of the antenna 302 for multiple frequencies. When a change in signal bands is requested by the transceiver via the connector 314, the processor 308 may program the variable tuning elements 322 to a previously stored optimal value for the newly requested band.

One advantage of the methods described above is that the tuning may be done with relatively low level signals. It is, for example, often desirable to tune the system without radiating significant energy, for either regulatory reasons or covert operation.

Figure 6:
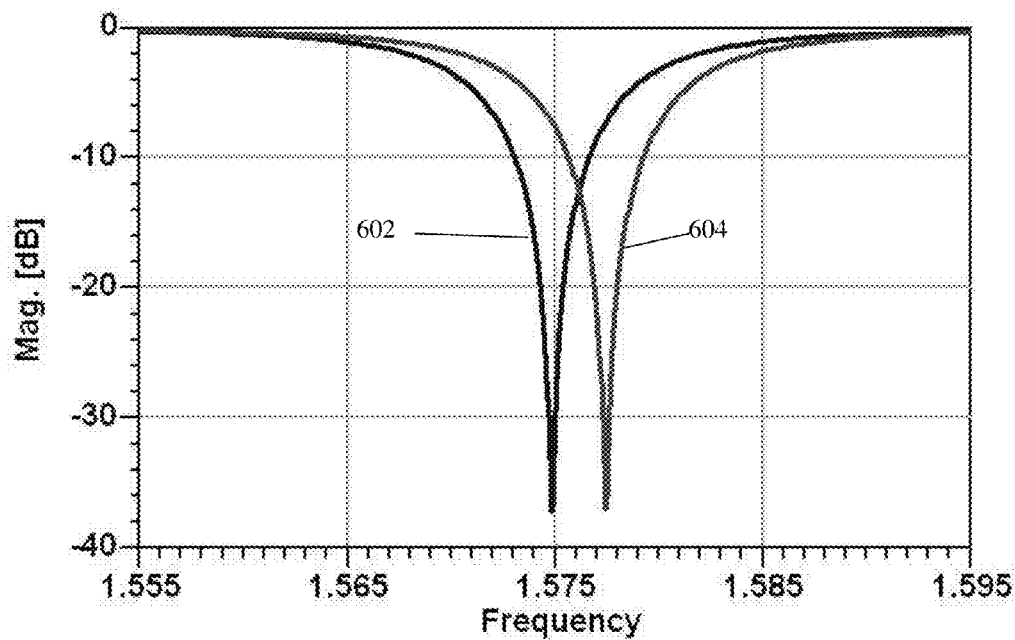
FIGS. 6 and 7 are graphs that each show the response of a tuned and mis-tuned antenna in accordance with one embodiment of the invention.
Figure 7:
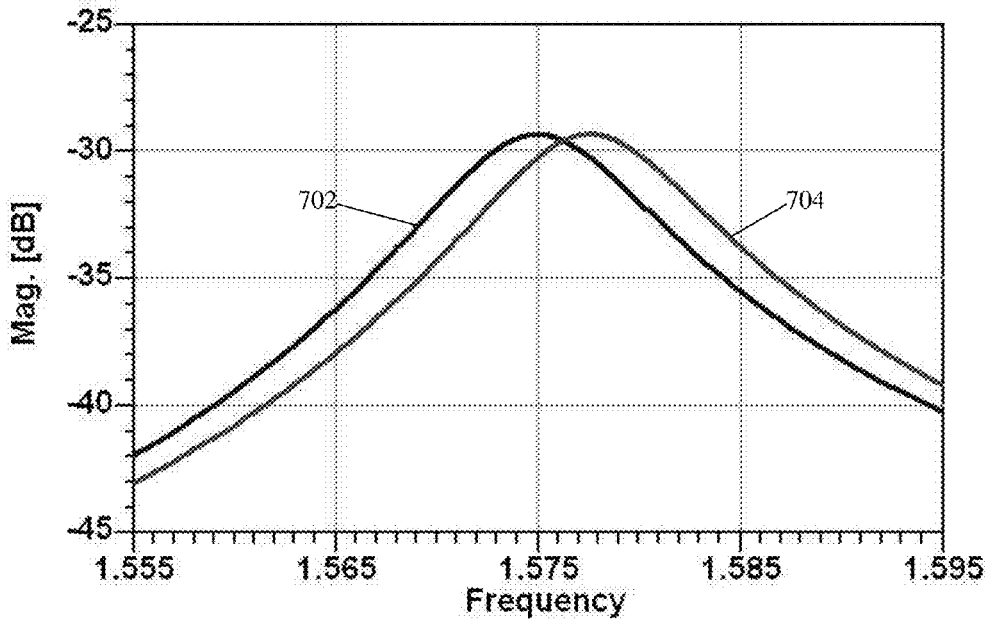

FIGS. 6 and 7 show predicted results for a single tuning detection element coupled to a linearly polarized patch antenna. FIG. 6 shows a first curve 602 representing the input match of the antenna when the antenna is tuned (here, to 1.575 GHz, the frequency of a GPS receiver). A second curve 604 shows what happens when the antenna is mis-tuned. As can be seen, the response of the antenna is shifted away from the desired frequency to a frequency corresponding to the center frequency of the mis-tuned antenna. FIG. 7 shows the corresponding tuning detection element response. A first curve 702 shows the tuning detection element response when the patch antenna is properly tuned and a second curve 704 shows the tuning detection element response when the patch antenna is mis-tuned. As is shown, the tuned first curve 702 has its maximum at 1.575 GHz, matching the center frequency of the tuned antenna 602. The second curve 704 has its maxima coincident with the center frequency of the mis-tuned antenna response 604. Thus, as described above, the coupled probe response may be monitored at the target frequency (here, 1.575 GHz), and, when it is maximized, the antenna is properly tuned. In one embodiment, different tuning algorithms are used for different severities of mis-tuning. For example, a nearly-tuned system may use a slow but fine-grained algorithm to precisely match the desired tuning frequency, while a grossly mis-tuned system may use a fast, coarse-grained algorithm to rapidly bring the system closer to the desired tuning frequency.

Figure 8:
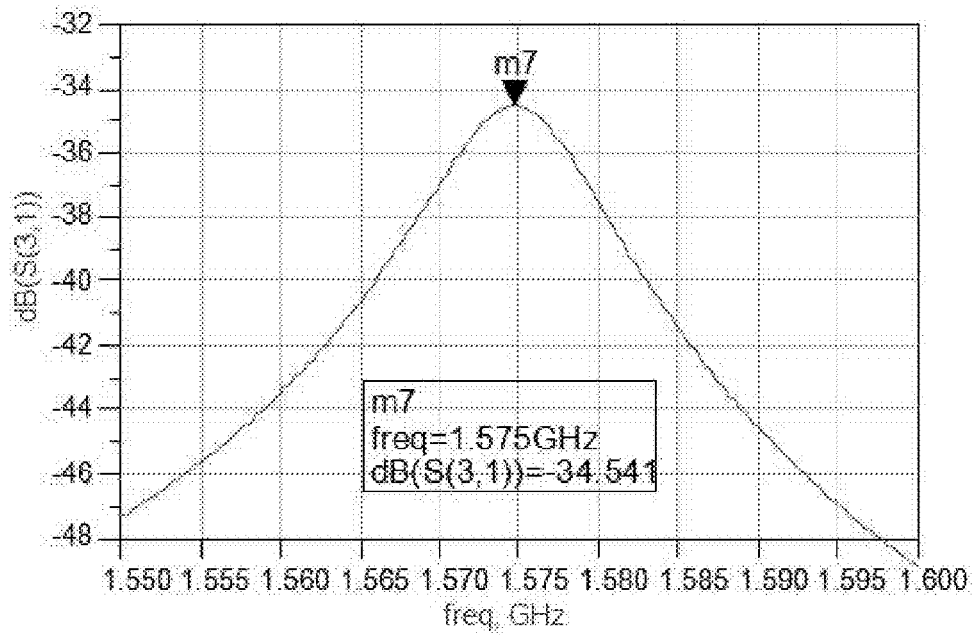
FIGS. 8 and 9 are graphs that showing cross-mode rejection between two tuning detection elements in accordance with one embodiment of the invention.
Figure 9:
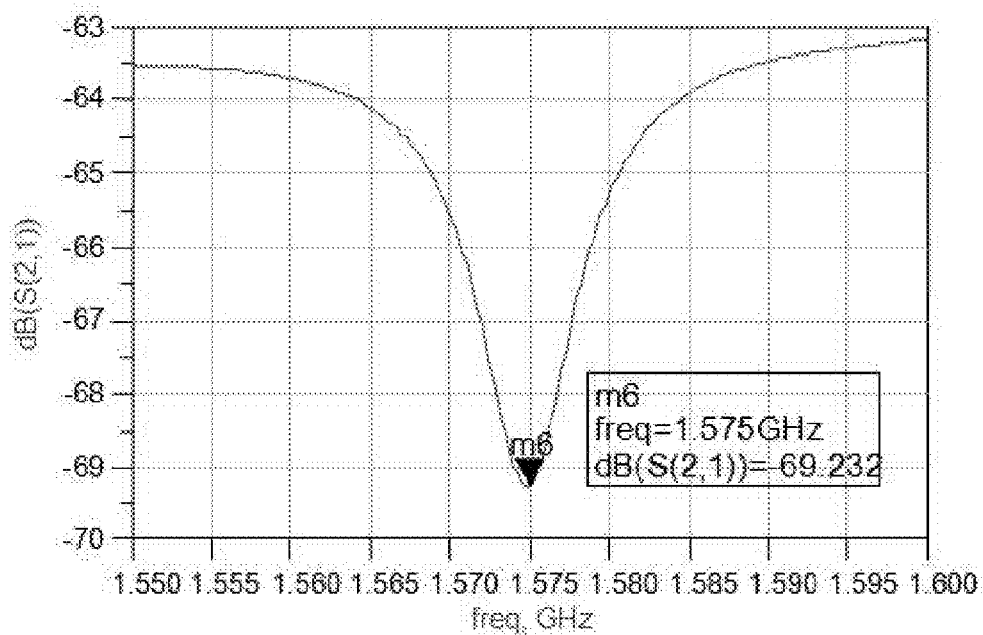

FIGS. 8 and 9 show the cross-mode isolation between two tuning detection elements adjacent to a patch antenna, such as, as shown in FIG. 2, tuning detection elements 204, 206 adjacent to the antenna 202. As described above, it is important in some applications for one tuning detection element to accept radiation of a certain polarization while the other tuning detection element rejects it, and vice versa. Here, FIG. 8 shows predicted results of a tuning detection element 204 on one side of the antenna 202 accepting frequencies near the target frequency (i.e., 1.575 GHz) for a given polarization, while FIG. 9 shows how the other tuning detection element 206 rejects a signal near the target frequency for the same polarization. Thus, configurations such as the one shown in FIG. 2 would allow for the tuning of a circularly polarized signal because each tuning detection element 204, 206 rejects the portion of the signal corresponding to the polarization of the other tuning detection element.

In one embodiment, the one or more tuning detection elements and the one or more tuning elements are both placed outside of a signal path of the antenna. In another embodiment, for a single mode antenna, the tuning detection element(s) are used with a conventional matching network (i.e., a matching network placed in the signal path between the antenna and an associated transceiver), such as a directional couple or VSWR bridge.

Embodiments of the invention have widespread applications in a number of commercially active areas, such as in cellular telephones, wireless LANs, GPS receivers, etc. For example, many cell phones use multi-mode antennas to cover the various cellular bands, and the approach of coupling into different modes provides an important capability that is not available at present.

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A system for automatically tuning a multi-mode antenna to a desired frequency, the antenna having a signal path for receiving a signal, the system comprising:
    a tuning detection element, coupled to at least one mode of the antenna and uncoupled from at least one other mode of the antenna, for transmitting a signal to the antenna in accordance with at least one mode of the antenna to which the tuning detection element is coupled, the tuning detection element located outside of the signal path and separated from the antenna by a gap;
    a processor for monitoring an amplitude of the signal received by the antenna; and
    a tuning element for tuning a resonant frequency of the antenna to the desired frequency based on an instruction from the processor.

2. The system of claim 1, wherein the instruction from the processor maximizes the received signal.

3. The system of claim 1, wherein the tuning element is located outside of the signal path and is not in direct electrical communication therewith.

4. The system of claim 1, further comprising a low-noise amplifier in the signal path.

5. The system of claim 1, further comprising a feedback path for transmitting a portion of an output of the signal path to the processor.

6. The system of claim 1, further comprising a driver circuit for driving the tuning detection element with the transmitted signal.

7. The system of claim 1, further comprising at least one additional tuning detection element for operation in accordance with at least one additional mode of the antenna.

8. The system of claim 7, wherein the signal path communicates a circularly polarized signal.

9. The system of claim 8, wherein the instruction from the processor minimizes the received signal.

10. The system of claim 1, wherein the antenna is at least one of a patch antenna, a planar inverted-F antenna, a monopole antenna, or a dipole antenna.

11. The system of claim 1, wherein the tuning element comprises at least one of a variable-capacitance device or a variable-inductance device.

12. The system of claim 1, wherein the tuning element comprises at least one of a varactor diode, a switched metal element, or a switched capacitor.

13. The system of claim 1, wherein a resonant frequency of the tuning detection element is non-overlapping with a frequency band of the antenna.

14. A method for automatically tuning a multi-mode antenna to a desired frequency, the method comprising:
    radiating energy proximate the antenna from a tuning detection element that is: (i) coupled to at least one mode of the antenna, (ii) uncoupled from at least one other mode of the antenna, and (iii) located outside of a signal path of the antenna and separated from the antenna by a gap, the energy being radiated in accordance with at least one mode of the antenna to which the tuning detection element is coupled;
    receiving a signal from the antenna in response to the energy radiated in accordance with the at least one mode;
    monitoring an amplitude of the received signal; and
    tuning a resonant frequency of the antenna to the desired frequency with a tuning element based on the monitored amplitude.

15. The method of claim 14, wherein tuning the antenna comprises maximizing the amplitude of the received signal.

16. The method of claim 14, further comprising radiating additional energy in accordance with at least one additional mode of the antenna.

17. The method of claim 16, wherein the antenna is tuned to receive a circularly polarized signal.

18. The method of claim 17, wherein tuning the antenna comprises minimizing the amplitude of the received signal.

19. The method of claim 14, wherein the antenna is tuned by a tuning element that is located outside of the signal path and that is not in direct electrical communication therewith.

20. The method of claim 14, wherein the antenna is at least one of a patch antenna, a planar inverted-F antenna, a monopole antenna, and a dipole antenna.

21. The method of claim 14, wherein the tuning element comprises at least one of a variable inductance device or a variable capacitance device.

22. The method of claim 14, wherein the tuning element comprises at least one of a varactor diode, a switched metal element, or a switched capacitor.

23. The method of claim 14, wherein the tuning detection element has a resonant frequency that is non-overlapping with a frequency band of the antenna.

24. A system for automatically tuning a multi-mode antenna to a desired frequency, the antenna having a signal path for transmitting a signal, the system comprising:
a tuning detection element coupled to at least one mode of the antenna and uncoupled from at least one other mode of the antenna, the tuning detection element located outside of the signal path and separated from the antenna by a gap and for receiving a signal transmitted from the antenna in accordance with at least one mode of the antenna to which the tuning detection element is coupled;
a processor for monitoring an amplitude of the signal received by the tuning detection element and for generating a tuning instruction based on the monitored amplitude; and
a tuning element for tuning a resonant frequency of the antenna to the desired frequency based on the tuning instruction generated by the processor.

25. The system of claim 24, wherein the instruction from the processor maximizes the received signal.

26. The system of claim 24, wherein the tuning element is located outside of the signal path.

27. The system of claim 24, further comprising a feedback path for transmitting a portion of an output of the signal path to the processor.

28. The system of claim 24, further comprising a receiver circuit for receiving the signal from the tuning detection element.

29. The system of claim 24, further comprising at least one additional tuning detection element for operation in accordance with at least one additional mode of the antenna.

30. The system of claim 29, wherein the signal path communicates a circularly polarized signal.

31. The system of claim 30, wherein the instruction from the processor minimizes the received signal.

32. The system of claim 24, wherein the antenna is at least one of a patch antenna, a planar inverted-F antenna, a monopole antenna, and a dipole antenna.

33. The system of claim 24, wherein the tuning element comprises at least one of a variable-inductance device or a variable-capacitance device.

34. The system of claim 24, wherein the tuning element comprises at least one of a varactor diode, a switched metal element, or a switched capacitor.

35. A method for automatically tuning a multi-mode antenna to a desired frequency, the method comprising:
transmitting a signal to the antenna over a signal path, thereby causing the antenna to radiate energy in accordance with at least one mode of the antenna;
receiving the energy radiated from the antenna at a tuning detection element that is: (i) coupled to at least one mode of the antenna, (ii) uncoupled from at least one other mode of the antenna, and (iii) located outside of the signal path, the received energy having been radiated from the antenna in accordance with at least one mode of the antenna to which the tuning detection element is coupled;
monitoring an amplitude of the received energy; and
tuning a resonant frequency of the antenna to the desired frequency with a tuning element based on the monitored amplitude.

36. The method of claim 35, wherein tuning the antenna comprises maximizing the amplitude of the received energy.

37. The method of claim 35, further comprising receiving additional energy radiated from the antenna in accordance with at least one additional mode of the antenna.

38. The method of claim 37, wherein the antenna is tuned to transmit a circularly polarized signal.

39. The method of claim 38, wherein tuning the antenna comprises minimizing the amplitude of the received energy.

40. A system for automatically tuning an antenna to a desired frequency, the system comprising:
a substrate having disposed thereon (i) an antenna having a signal path for receiving a signal, and (ii) a tuning detection element, having a resonant frequency that is non-overlapping with a frequency band of the antenna, for transmitting a signal to the antenna, the tuning detection element located outside of the signal path and separated from the antenna by a gap;
a processor for monitoring an amplitude of the signal received by the antenna; and
a tuning element for tuning a resonant frequency of the antenna to the desired frequency based on an instruction from the processor.

41. A method for automatically tuning an antenna to a desired frequency, the method comprising:
radiating energy proximate an antenna disposed on a substrate from a tuning detection element disposed on the substrate, the tuning detection element (i) having a resonant frequency that is non-overlapping with a frequency band of the antenna, and (ii) located outside of a signal path of the antenna and separated from the antenna by a gap;
receiving a signal from the antenna in response to the radiated energy;
monitoring an amplitude of the received signal; and
tuning a resonant frequency of the antenna to the desired frequency with a tuning element based on the monitored amplitude.

* * * * *